US008653618B2

(12) United States Patent
Kim

(10) Patent No.: US 8,653,618 B2
(45) Date of Patent: Feb. 18, 2014

(54) UNIT PIXEL OF COLOR IMAGE SENSOR AND PHOTO DETECTOR THEREOF

(76) Inventor: Hoon Kim, Seoul (KR)

( * ) Notice: Subject to any disclaimer, the term of this patent is extended or adjusted under 35 U.S.C. 154(b) by 202 days.

(21) Appl. No.: 13/224,876

(22) Filed: Sep. 2, 2011

(65) Prior Publication Data

US 2013/0056806 A1      Mar. 7, 2013

(51) Int. Cl.
*H01L 31/08*      (2006.01)
(52) U.S. Cl.
USPC ................. 257/440; 257/462; 257/E33.076
(58) Field of Classification Search
USPC .............. 257/440, 462, E31.122, E33.076
See application file for complete search history.

(56) References Cited

U.S. PATENT DOCUMENTS

| | | | | |
|---|---|---|---|---|
| 4,598,305 | A * | 7/1986 | Chiang et al. | 257/66 |
| 4,893,273 | A * | 1/1990 | Usami | 365/185.04 |
| 5,557,114 | A * | 9/1996 | Leas et al. | 257/59 |
| 5,789,276 | A * | 8/1998 | Leas et al. | 438/59 |
| 5,965,875 | A | 10/1999 | Merrill | |
| 6,043,508 | A * | 3/2000 | Oikari et al. | 257/10 |
| 6,081,018 | A * | 6/2000 | Nakashiba et al. | 257/435 |
| 6,166,768 | A * | 12/2000 | Fossum et al. | 348/308 |
| 6,309,907 | B1 * | 10/2001 | Forbes et al. | 438/105 |
| 6,746,893 | B1 * | 6/2004 | Forbes et al. | 438/105 |
| 6,762,068 | B1 * | 7/2004 | Forbes et al. | 438/16 |
| 6,965,123 | B1 * | 11/2005 | Forbes et al. | 257/77 |
| 7,129,466 | B2 * | 10/2006 | Iwasaki | 250/214.1 |
| 7,141,824 | B2 * | 11/2006 | Forbes et al. | 257/77 |
| 7,166,830 | B2 * | 1/2007 | Kitahara et al. | 250/214 R |
| 7,355,249 | B2 * | 4/2008 | Clark et al. | 257/351 |
| 7,400,023 | B2 * | 7/2008 | Watanabe et al. | 257/448 |
| 7,547,912 | B2 * | 6/2009 | Osaka et al. | 257/40 |
| 7,579,665 | B2 * | 8/2009 | Yokoyama et al. | 257/440 |
| 7,586,528 | B2 * | 9/2009 | Fukunaga et al. | 348/274 |
| 7,623,165 | B2 | 11/2009 | Gruhlke et al. | |

(Continued)

FOREIGN PATENT DOCUMENTS

| JP | 11-312798 A | 11/1999 |
|---|---|---|
| KR | 10-0558527 B1 | 3/2006 |
| KR | 10-2009-0043737 A | 5/2009 |

OTHER PUBLICATIONS

Zhang et al., High gain gate/body tied NMOSFET photo-detector on SOI substrate for low power applications, Solid-State Electronics, 44, 2000, pp. 535-540.*

(Continued)

*Primary Examiner* — David Vu
*Assistant Examiner* — Earl Taylor
(74) *Attorney, Agent, or Firm* — McKenna, Long & Aldridge, LLP.

(57) ABSTRACT

A unit pixel of an image sensor and a photo detector are disclosed. The photo detector of the present invention can include: a light-absorbing part configured to absorb light by being formed in a floated structure; an oxide film having one surface thereof being in contact with the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel formed between the source and the drain and configured to form flow of an electric current between the source and drain.

13 Claims, 6 Drawing Sheets

(56) References Cited

U.S. PATENT DOCUMENTS

| | | | |
|---|---|---|---|
| 8,013,412 B2 * | 9/2011 | Tian | 257/440 |
| 8,080,856 B2 * | 12/2011 | Golan et al. | 257/458 |
| 8,106,457 B2 * | 1/2012 | Clark et al. | 257/348 |
| 2005/0146934 A1 * | 7/2005 | Forbes et al. | 365/185.12 |
| 2006/0054987 A1 * | 3/2006 | Nii | 257/440 |
| 2006/0273362 A1 * | 12/2006 | Osaka et al. | 257/292 |
| 2007/0052051 A1 * | 3/2007 | Osaka et al. | 257/440 |
| 2009/0152664 A1 * | 6/2009 | Klem et al. | 257/440 |
| 2009/0294890 A1 * | 12/2009 | Graetzel et al. | 257/440 |
| 2013/0056708 A1 * | 3/2013 | Kim | 257/30 |
| 2013/0056709 A1 * | 3/2013 | Kim | 257/30 |
| 2013/0056806 A1 * | 3/2013 | Kim | 257/290 |

OTHER PUBLICATIONS

Park et al., Highly Sensitive Active Pixel Sensor Using a PMOSFET Photodetector, Journal of the Korean Physical Society, vol. 44, No. 1, 2004, pp. 157-161.*

Seo et al., Pseudo 2-Transistor Active Pixel Sensor Using an N-well/Gate-Tied P-Channel Metal Oxide Semiconductor Field Eeffect Transistor-Type Photodetector with Built-in Transfer Gate, Optical Review, vol. 15, No. 6, 2008, pp. 280-284.*

* cited by examiner

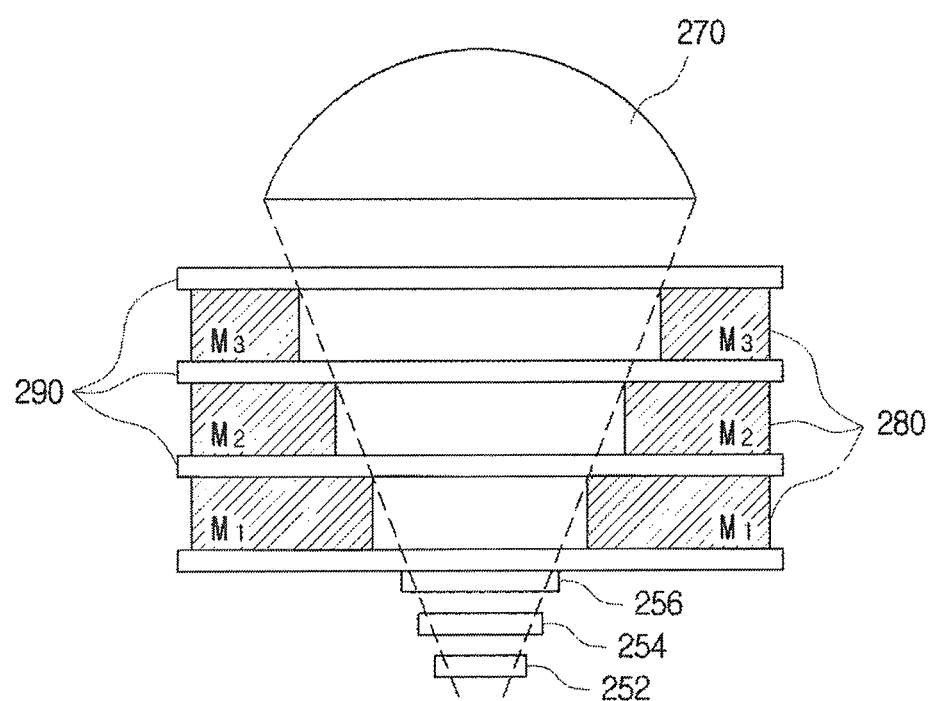

UNIT PIXEL OF COLOR IMAGE SENSOR AND PHOTO DETECTOR THEREOF

BACKGROUND

1. Field of the Invention

Embodiments of the present invention relate to a unit pixel of a color image sensor and a photo detector thereof.

2. Description of the Related Art

An image sensor is a sensor that transforms an optical signal to an electrical image signal. When light is irradiated to a light-absorbing part inside a unit pixel of an image sensor chip, the image sensor detects the light incident at each unit pixel and the amount of the light and transforms an optical signal to an electrical signal and then transfers the electrical signal to analog and digital circuits for forming an image.

The conventional image sensors can be classified into CCD (Charge Coupled Device) types and CMOS (Complementary Metal Oxide Semiconductor) types, based on their structures and operation principles. The CMOS type image sensors are commonly referred to as CIS (CMOS Image Sensor).

In the CCD type image sensor, groups of signal electrons generated at the pixels by the light are transmitted to an output unit by a pulse applied to a gate, transformed to voltages of the output unit, and sent out one by one.

In the CMOS type image sensor, the signal electrons and holes that are generated at the pixels by the light are transformed to voltages inside the pixels. These voltages are connected to a signal processor, including a row decoder and a column decoder, and sent out of the pixels by a switching operation according to a clock frequency.

One electron-hole pair (EHP) is generated for one photon that is incident at a unit pixel light-absorbing part of an image sensor, and the generated electrons and holes are accumulated in a photo diode, which is a light-absorbing part.

The maximum accumulation electrostatic capacity of a photo diode is proportional to the area of photo detection of the photo diode. Particularly, in the case of CMOS type image sensor, the area in which the accompanying transistors are arranged is larger than that of the CCD type image sensor, and thus increasing the area of the light-absorbing part is physically limited. Moreover, the photo diode, which is commonly used as the light-absorbing part of an image sensor, has relatively small electrostatic capacity and thus is easily saturated, and it is difficult to segment the signals generated by the light-absorbing part.

Therefore, the unit pixels of the CMOS image sensor require a relatively long photoelectric charge accumulation time in order to generate a minimum electric charge for signal processing through the limited photo detection area. Accordingly, it is not easy to manufacture a high-density/high-speed frame image sensor by using the unit pixels having this kind of light-absorbing part.

The band gap of a silicon semiconductor is 1.12 eV, and a photo detector made of a silicon semiconductor can detect light energy in wavelengths of 350 nm to 1150 nm. Here, since the light has different inherent energy per wavelength and has different depth of penetration when the light penetrates silicon, which is solid, the photoelectric efficiency for each wavelength is also different at the photo detector. In order to detect the wavelengths of visible rays (400-700 nm), the image sensor forms an interface of P-N junction so that a green ray, which commonly has energy in the wavelength of 550 nm, can be better detected. Therefore, in the image sensor having this structure, photoelectric efficiencies for a short wavelength, such as blue color, and a long wavelength of a near infrared ray are deteriorated, or the optical signal is transformed to a noise.

Prior arts related to an image sensor and a unit pixel of an image sensor include U.S. Pat. No. 5,965,875 ("COLOR SEPARATION IN AN ACTIVE PIXEL CELL IMAGING ARRAY USING A TRIPLE-WELL STRUCTURE") and U.S. Pat. No. 7,623,165 B2 ("VERTICAL TRI-COLOR SENSOR").

U.S. Pat. No. 5,965,875 discloses color separation in an active pixel MOS imaging array using the differences in absorption length in silicon of light of different wavelengths. For this, the array of U.S. Pat. No. 5,965,875 uses a triple-well structure to ensure that each pixel sensor measures each of the three primary colors (RGB) in the same location.

However, U.S. Pat. No. 5,965,875 requires a certain distance of separation between adjacent unit pixels due to the property of the triple-well structure, inevitably increasing the size of unit pixels. Moreover, since three P-N junction photo diodes are generated through the triple-well structure, the problem of low sensitivity, which is a limitation the photo diode method has, cannot be solved. Furthermore, due to the property of the triple-well structure, the pixel sizes become smaller from the red pixels to the green pixels and then to the blue pixels. Therefore, some of the blue light incident at a color array sensor is incident outside the blue pixels, and some of the green light is incident outside the green pixels, thereby lowering the sensitivity of the color array sensor for the blue light and green light and failing to completely render the blue and green colors.

U.S. Pat. No. 7,623,165 relates to a vertical tri-color sensor having vertically stacked blue, green and red pixels, and discloses that the vertical tri-color sensor detects blue, green and red components of incident light by converting the blue, green and red components to surface plasmons.

However, in U.S. Pat. No. 7,623,165, since green light and red light are reflected by a plurality of vertically stacked metal layers because a particular wavelength of incident light is selectively transmitted using the surface plasmon phenomenon, the sensitivity of color array sensors for the green and red lights is deteriorated, and the actual green and red colors cannot be realized. Moreover, since a wave form of metal layer having a particular period and thickness needs to be generated between dielectric layers in order to realize the surface plasmon phenomenon, the manufacturing processes are complicated, and the manufacturing costs are increased. Furthermore, a blue stack, a green stack and a red stack need to be separated and manufactured and then stacked together in order to manufacture the color array sensors, the manufacturing processes become complicated, and the defect rates are increased.

SUMMARY

Contrived to solve the above problems, embodiments of the present invention provide a unit pixel of a high-sensitivity/high-performance color image sensor and a photo detector of the unit pixel that can output a great photoelectric current with a small quantity of light, realize a high-speed frame operation in an environment of low level of illumination, and record a video ranging from low to high levels of illumination in a same screen.

An aspect of the present invention features a photo detector configured to absorb light in a unit pixel of an image sensor transforming the absorbed light to an electrical signal. The photo detector in accordance with an embodiment of the present invention can include: a light-absorbing part configured to absorb light by being formed in a floated structure; an oxide film having one surface thereof being in contact with the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel formed between the source and the drain and configured to form flow of an electric current between the source and drain. The light-absorbing part can be doped with first type impurities, and the source and the drain can be doped with second type impurities. The light-absorbing part can be insulated from the source and the drain by the oxide film. The light-absorbing part can include: a first light-absorbing part being in contact with the oxide film and configured to absorb red light of the absorbed light; a second light-absorbing part formed above the first light-absorbing part and configured to absorb green light of the absorbed light; a third light-absorbing part formed above the second light-absorbing part and configured to absorb blue light of the absorbed light; a first insulation layer formed in between the first light-absorbing part and the second light-absorbing part; and a second insulation layer formed in between the second light-absorbing part and the third light-absorbing part. Electron-hole pairs can be formed in the light-absorbing part by light incident to the light-absorbing part. Tunneling can occur through the oxide film between at least one of the source and the drain and the light-absorbing part. Electrons of the electron-hole pairs can be discharged to at least one of the source and the drain from the light-absorbing part by the tunneling. Flow of electric current of the channel can be controlled by a change in the quantity of electric charge of the light-absorbing part by the discharge of the electrons.

The light-absorbing part, the light-absorbing part and the light-absorbing part may not be formed with a metallic silicide layer on an upper surface thereof.

The light-absorbing part, the second light-absorbing part and the third light-absorbing part can be doped with same impurities in same concentrations.

The channel can be formed in a state immediately before pinch-off by adjusting a W/L ratio, which is a ratio between a width (W) and a length (L) of the photo detector.

A threshold voltage of the photo detector can be changed due to a tunneling effect occurred in the oxide film.

The photo detector can also include a light-blocking layer formed on a surface other than the light-absorbing part and configured to block transmission of light in areas other than the light-absorbing part.

Another aspect of the present invention features a unit pixel of an image sensor configured to transform absorbed light to an electrical signal. The unit pixel of an image sensor in accordance with an embodiment of the present invention can include: a photo detector configured to cause an electric current to flow using a change in the quantity of electric charge caused by incident light; and a select device configured to output the electric current generated by the photo detector to a unit pixel output terminal. The photo detector can include: a light-absorbing part formed in a floated structure, electron-hole pairs being generated by the absorbed light in the light-absorbing part; an oxide film having one surface thereof being in contact with the light-absorbing part; a source being in contact with one side of the other surface of the oxide film and separated from the light-absorbing part with the oxide film therebetween; a drain facing the source so as to be in contact with the other side of the other surface of the oxide film and separated from the light-absorbing part with the oxide film therebetween; and a channel formed between the source and the drain and configured to form flow of an electric current between the source and drain. The light-absorbing part can be doped with first type impurities, and the source and the drain can be doped with second type impurities. The light-absorbing part can be insulated from the source and the drain by the oxide film. Tunneling can occur through the oxide film between at least one of the source and the drain and the light-absorbing part. Electrons of the electron-hole pairs can be discharged to at least one of the source and the drain from the light-absorbing part by the tunneling. Flow of electric current of the channel can be controlled by a change in the quantity of electric charge of the light-absorbing part by the discharge of the electrons. The photo detector can include a red photo detector, a green photo detector and a blue photo detector. A light-absorbing part of the red photo detector can include: a first light-absorbing part being in contact with the oxide film and configured to absorb red light of the absorbed light; a second light-absorbing part formed above the first light-absorbing part and configured to absorb green light of the absorbed light; a third light-absorbing part formed above the second light-absorbing part and configured to absorb blue light of the absorbed light; a first insulation layer formed in between the first light-absorbing part and the second light-absorbing part; and a second insulation layer formed in between the second light-absorbing part and the third light-absorbing part. A light-absorbing part of the green photo detector can be connected with the second light-absorbing part by a first connection line. A light-absorbing part of the blue photo detector can be connected with the third light-absorbing part by a second connection line. The select device can include: a drain being connected with the source of the photo detector; a source being accessed to the unit pixel output terminal; and a gate configured to receive a control signal from an outside, and a switching operation can be performed based on the control signal. The select device can include: a first select device connected to the red photo detector; a second select device connected to the green photo detector; and a third select device connected to the blue photo detector.

A metallic silicide layer can be formed above the light-absorbing part of the green photo detector and the light-absorbing part of the blue photo detector.

The first connection line and the second connection line can be made of poly-silicon or metal.

The unit pixel can also include a light-blocking layer formed on a surface other than the light-absorbing part of the red photo detector and configured to block transmission of light in areas other than the light-absorbing part of the red photo detector, and the light-absorbing parts of the red photo detector and the green photo detector can be blocked from light by the light-blocking layer.

The channel can be formed in a state immediately before pinch-off by adjusting a W/L ratio, which is a ratio between a width (W) and a length (L) of the photo detector.

The unit pixel can also include a micro lens configured to converge light incident to the photo detector, and a light incident path from the micro lens to the first light-absorbing part can have a focal point below the first light-absorbing part.

The light incident path can be defined by arrangement of multiple layers of metal lines formed between the micro lens and the third light-absorbing part.

BRIEF DESCRIPTION OF THE DRAWINGS

FIG. 6 is a cross-sectional view illustrating an incident angle of light of the color tunnel junction photo detector in accordance with an embodiment of the present invention.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

Hereinafter, certain embodiments of the present invention will be described with reference to the accompanying drawings.

Figure 1:
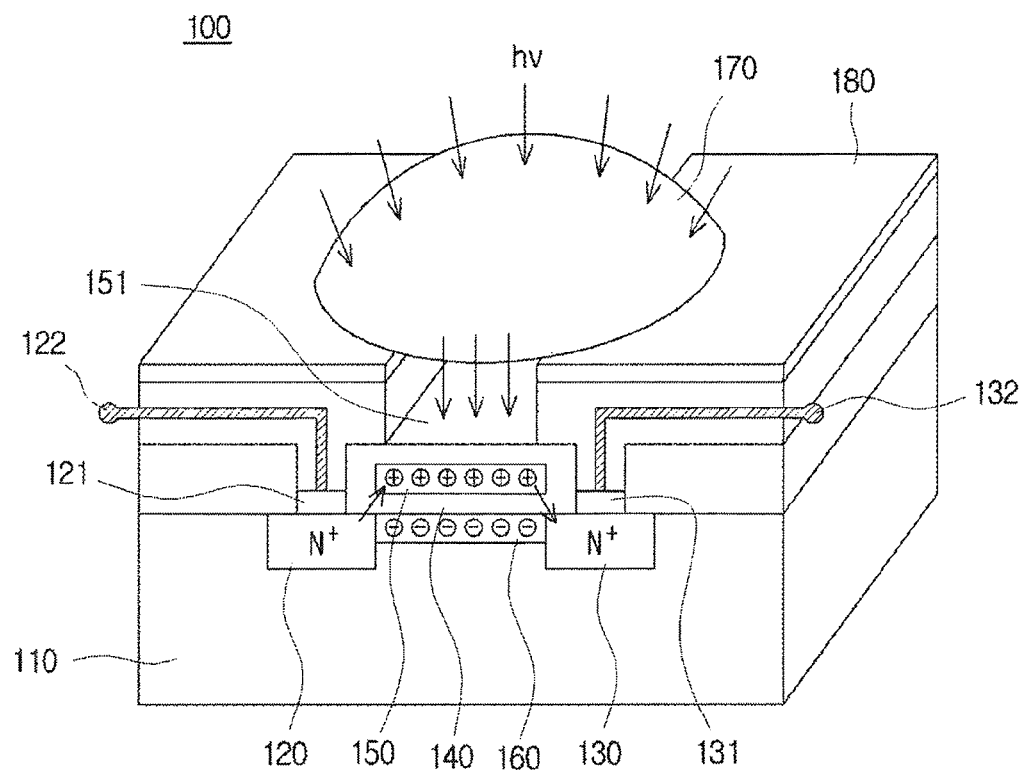
FIG. 1 is a perspective cross-sectional view of a tunnel junction photo detector of a unit pixel in accordance with an embodiment of the present invention.

FIG. 1 is a perspective cross-sectional view of a tunnel junction photo detector of a unit pixel in accordance with an embodiment of the present invention. As illustrated in FIG. 1, a photo detector of a unit pixel is realized using a tunnel junction instead of the conventional photo diode. Here, a tunnel junction device, in which a thin insulation layer is joined in between two conductors or semiconductors, refers to a device that operates using a tunneling effect generated in the insulation layer. For reference, the tunneling effect is a quantum mechanical phenomenon in which a particle passes through an area having a greater potential energy than its inherent dynamic energy under a strong electric field.

In an embodiment of the present invention, the photo detector of a unit pixel can be generated using said tunnel junction device, and the "tunnel junction photo detector" in the description and claims of the present invention refers to a photo detector realized using said tunnel junction device. The tunnel junction photo detector can be realized using various kinds of structures, for example, the general n-MOSFET or p-MOSFET structure. Also, in addition to MOSFET, the unit pixel can be realized using an electronic device having a structure that can provide a tunneling effect, for example, JFET, HEMT, etc.

Hereinafter, the structure and operation principle of the tunnel junction photo detector will be described.

In FIG. 1, a tunnel junction photo detector 100 is realized in an NMOS structure. The tunnel junction photo detector 100 is formed on a p-type substrate 110 and includes an N+ diffusion layer 120 corresponding to a source and an N+ diffusion layer 130 corresponding to a drain in a general NMOS electronic device. Hereinafter, the N+ diffusion layers 120, 130 will be referred to as the "source" and "drain" in the tunnel junction photo detector, respectively.

Formed in between the source 120 and the drain 130 is a thin oxide film 140, which is a dielectric, and formed above the oxide film 140 is a poly-silicon 150, in which a p-type impurity is doped, corresponding to the gate in the NMOS structure. Here, in order to facilitate the tunneling phenomenon, it is preferable that the oxide film 140 is formed in the thickness of 10 nm or less, for example, 2 nm, 5 nm, 7 nm, etc.

Unlike a gate in a general NMOS electronic device, the poly-silicon 150 is formed in a floated structure. In addition, the poly-silicon 150 does not form a silicide layer above the poly-silicon 150 and operates as an area that absorbs light. If a silicide layer is formed over the poly-silicon 150, metallic impurities make it difficult for electron-hole pairs to be formed by the light and for the light to permeate into the poly-silicon 150 because the incident light is reflected.

Hereinafter, an area of the poly-silicon 150 of the tunnel junction photo detector 100 in the description and claims of the present invention will be referred to as a "light-absorbing part."

Formed above the source 120 and the drain 130 are metal contacts 121, 131 that are respectively connected with outside nodes. The metal contact 121 of the source 120 is connected with an outside through a metal line 122, and the metal contact 131 of the drain 130 is likewise connected with an outside through a metal line 132.

The tunnel junction photo detector 100 is formed in a structure in which the p-type substrate 100 is floated, unlike the general NMOS electronic device. Accordingly, the tunnel junction photo detector 100 is different in structure from the general NMOS electronic device in that only the source 120 and the drain 130 are connected with the outside nodes.

Moreover, the tunnel junction photo detector 100 can be formed symmetrically. Accordingly, it is possible that the source 120 and the drain 130 are substituted with each other.

An upper part of the photo detector 100 excluding the light-absorbing part 150 has a light-blocking layer 180 formed thereon. The light-blocking layer 180 blocks the light from being absorbed in areas other than the light-absorbing part 150. This is to efficiently tunnel photoelectric charges of the light-absorbing part 150. Moreover, this is to inhibit parasitic electric charges from being generated by the absorption of light in areas other than the light-absorbing part 150 as well as to obtain controlled photoelectric current. The light-blocking layer 180 can be formed through a silicide process and can be prevented from being formed over the light-absorbing part 150 through the use of a mask.

A micro lens 170 is formed above the light-blocking layer 180 and converges the light incident at the photo detector 100 to the light-absorbing part 150. Specifically, the micro lens 170 is transferred with the light incident at an image sensor through an optical lens (not shown).

The micro lens 170 converges light that is incident at front surface of the unit pixel and irradiates the incident light to an upper surface 151 of the light-absorbing part 150. Here, the upper surface 151 of the light-absorbing part 150 can be directly exposed to the air, or a preservation layer, through which light can readily permeate, can be formed in between the light-absorbing part 150 and the air.

An electric field is formed between the source 120 and drain 130 and the light-absorbing part 150 by the incident light, and a channel 160 is formed between the source 120 and the drain 130.

Specifically, the light incident at the light-absorbing part 150 generates electron-hole pairs in the light-absorbing part 150. The electrons of the generated electron-hole pairs freely move inside the light-absorbing part 150 like free electrons. Meanwhile, tunneling occurs at the oxide film 140 between the source 120 and drain 130 and the light-absorbing part 150. The electrons of the generated electron-hole pairs are discharged from the light-absorbing part 150 to the source 120 or drain 130 by the effect of the tunneling. Due to the loss of the electrons, the quantity of electric charge in the hole of the light-absorbing part 150 becomes relatively increased. Accordingly, the channel 160 is formed and electric current becomes to flow between the source 120 and the drain 130 due to the effect of electric field caused by the change in voltage of the light-absorbing part 150.

Figure 2:
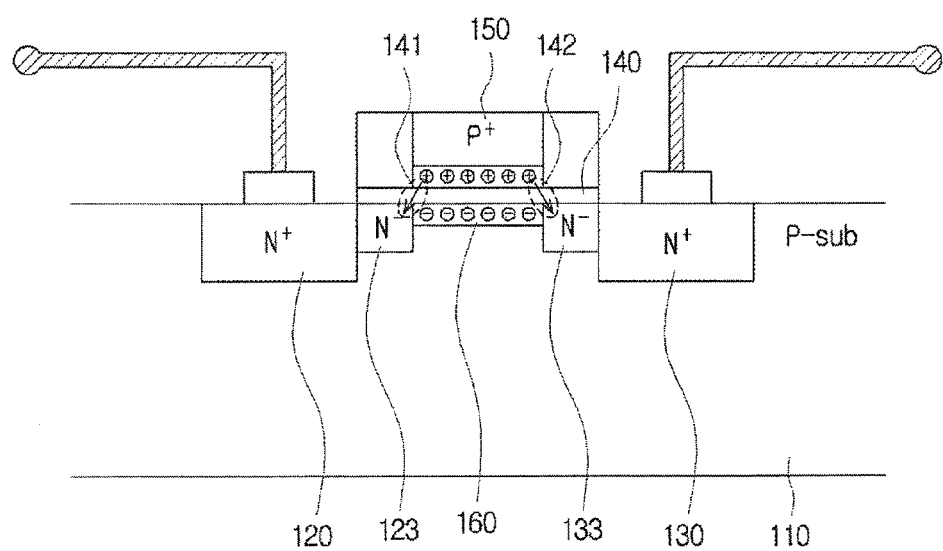
FIG. 2 is a cross-sectional view of the tunnel junction photo detector of a unit pixel in accordance with an embodiment of the present invention.

FIG. 2 is a cross-sectional view of the tunnel junction photo detector realized in an LDD (light doped drain) structure in accordance with an embodiment of the present invention. By realizing the tunnel junction photo detector in an LDD structure, it becomes possible to decrease the generation of a hot carrier caused by a short channel effect.

In FIG. 2, the tunnel junction photo detector 100 is formed on the p-type substrate 110, and LDD areas 123, 133 that are lightly doped can be respectively formed adjacently to the source 120 and the drain 130, both of which are N+ diffusion layers. Moreover, the light-absorbing part 150 can be formed above the oxide film 140 in a length that is similar to the distance between the LDD area 123 of the source and the LDD area 133 of the drain.

When light having greater energy than energy to which doped impurities are coupled is irradiated to the light-absorbing part 150, light having greater energy than coupling energy of the doped holes is incident at the light-absorbing part 150, which is poly-silicon in which p-type impurities are doped, the plurality of holes formed by doping the impurities become a free state within a boundary defined by the oxide film 140, which prevents the electric charge from moving in an equilibrium state. Here, the generated electron-hole pairs are present in the states of electrons and holes for a predetermined duration until they are recombined, increasing the number of holes locally and thus increasing the quantity of electric charge.

The separated electrons freely move outside a grain boundary of the poly-silicon. Here, if an outside voltage is supplied to the drain 130, the electrons are pulled to and accumulated near an edge of the LDD area 133 of the drain, thereby forming an electric field. The electric field becomes stronger as the number of converged electrons increases, and the phenomenon of convergence of electrons near the edge of the light-absorbing part 150 becomes accelerated more as the electric field becomes stronger. The more intense the light irradiated to the light-absorbing part 150 is, the more electron-hole pairs are formed and the greater electric field is formed.

The tunneling phenomenon mostly occurs at boundary areas 141, 142 where the distances between the light-absorbing part 150 and the LDD areas 123, 133 are the shortest. A tunneling effect occurs while energy level conditions are satisfied in the boundary areas 141, 142. By the tunneling effect, the electrons converged in the boundary areas 141, 142 of the light-absorbing part 150 can be moved to the source 120 or the drain 130. In such a case, the total quantity of electric charge of the light-absorbing part 150 is changed. That is, the quantity of electric charge of the holes is relatively increased by as much as the number of electrons lost by the tunneling effect, and the channel 160 is formed between the source 120 and the drain 130 due to an electric field effect caused by a change of voltage. Electric current flows through the formed channel 160.

Meanwhile, if the intensity of light becomes smaller or the light is blocked, the quantity of electric charge returns to its original state, in an opposite way to the above phenomenon. In case the light is intensely irradiated and then blocked, the light-absorbing part 150 becomes to have a quantity of weak (+) electric charge due to the increase in the quantity of electrons, but an electric field is formed by the electrons accumulated in the boundary area 142 of the LDD area 133 of the drain and the boundary area 141 of the LDD area 123 of the source, in which electric potentials are relatively low. Afterwards, the tunneling effect occurs in the boundary areas 141, 142 in directions the electrons flowing into the light-absorbing part 150. When the electrons flowed in by the tunneling effect are recombined with the holes, the quantity of (+) electric charge becomes decreased. This will weaken the electric field by the light-absorbing part 150, and reduce or eliminate the channel 160 between the source 120 and the drain 130. Accordingly, the electric current flowing through the channel 160 stops flowing.

The channel 160 is designed in a manufacturing process of the tunnel junction photo detector 100 in such a way that the channel 160 is in a state immediately before pinch-off. The channel 160 is generated by a voltage difference between the source 120 and the drain 130. The channel 160 is manufactured by adjusting a W/L ratio, which is a ratio between its width and length, in the manufacturing process so that the channel 160 is in the state immediately before pinch-off while no outside voltage is supplied to the source 120 and the drain 130. Here, the W/L can be designed experimentally for each manufacturing process of the tunnel junction photo detector since the conditions in which pinch-off occurs can be different for each doping concentration of an element and each property of the tunnel junction photo detector.

The tunneling phenomenon occurs continuously in the boundary area 141, 142 between the LDD areas of the source 120 and drain 130 and the light-absorbing part 150. However, tunneling is more prominent in the side of the drain 130 when the intensity of light is greater, and in the side of the source 120 when the intensity of light is smaller, thereby maintaining the state of equilibrium.

Through the above structure of photo detector, it becomes possible to flow photoelectric currents that are hundreds to thousands times greater than the conventional photo diode. While the conventional photo diode distinguishes the brightness only by the quantity of electric charge accumulated in the electrostatic capacity, the change in the quantity of electric charge of the light-absorbing part caused by the light works as the electric field effect in the photo detector in accordance with an embodiment of the present invention, thereby controlling the electric current flow of the channel. Moreover, since the required electric charge can be infinitely supplied through the drain, a signal can be self-amplified in the photo detector. Therefore, it is possible to realize a unit pixel in a PPS structure, without introducing an additional signal amplification device. Of course, it is also possible to realize a unit pixel using the conventional APS method. In the present embodiment, however, the unit pixel is realized in the PPS structure using the tunnel junction photo detector, for the convenience of description and understanding.

Figure 3:
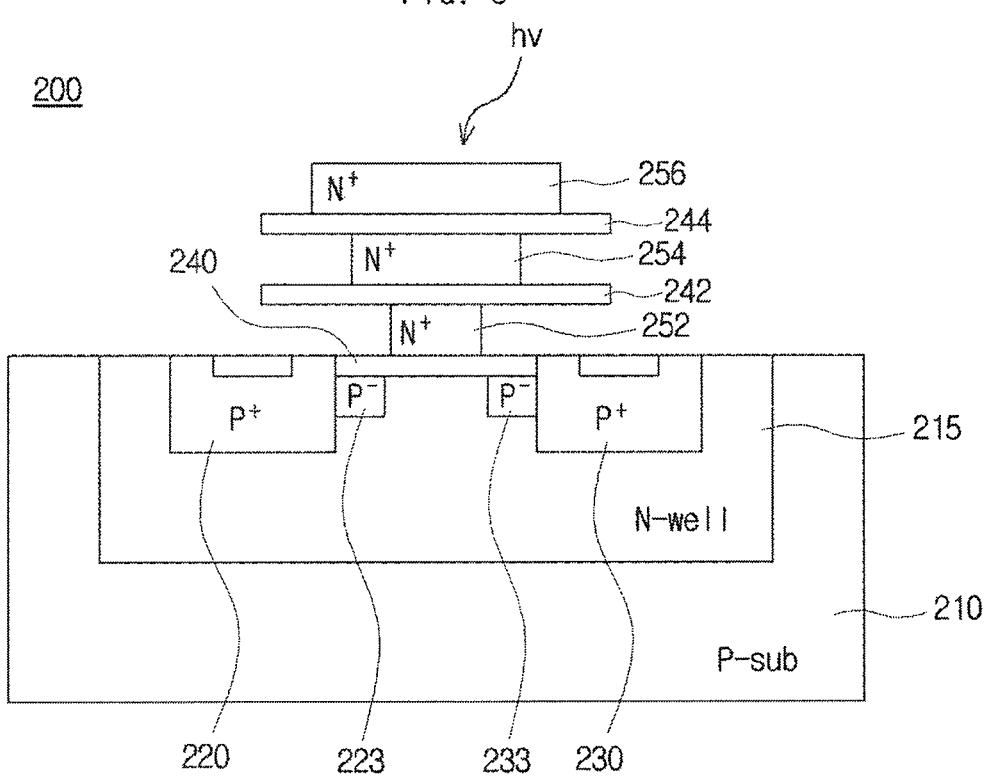
FIG. 3 is a cross-sectional view of a color tunnel junction photo detector in accordance with an embodiment of the present invention.

FIG. 3 is a cross-sectional view of a color tunnel junction photo detector 200 in accordance with an embodiment of the present invention. As illustrated in FIG. 3, the color tunnel junction photo detector is formed in a structure in which multiple poly-silicon layers 254, 256 are stacked above a poly-silicon layer 252 of a light-absorbing part. Here, SiO2 insulation layers 242, 244 are formed in between the poly-silicon layers 252, 254, 256 so that the poly-silicon layers 252, 254, 256 are electrically from one another.

Hereinafter, the poly-silicon layers 252, 254, 256 will be referred to as a first light-absorbing part 252, a second light-absorbing part 254 and a third light-absorbing part 256, respectively. Moreover, the first light-absorbing part 252, the second light-absorbing part 254 and the third light-absorbing part 256 will be collectively referred to as a light-absorbing part 250.

A band gap of a light-absorbing part made of silicon is 1.12 eV and can detect light energy in the wavelengths of 350-1150 nm. The energy absorbed to the light is different according to the penetration depth of the light-absorbing part 250, and thus the efficiency of detected wavelength is different according to the depth of a p-n junction surface from a silicon surface. The blue light having the wavelength of 400-490 nm is mostly absorbed in silicon in the depth of 0.2-0.5 microns.

The green light having the wavelength of 490-575 nm is mostly absorbed in silicon in the depth of 0.5-1.5 microns. The red light having the wavelength of 575-700 nm is mostly absorbed in silicon in the depth of 1.5-3.0 microns. Accordingly, the third light-absorbing part 256, which is formed in the uppermost part of the light-absorbing part 250, can be formed in the thickness of about 0.2-0.5 microns so that the blue light can be absorbed.

The second light-absorbing part 254, which is formed below the third light-absorbing part 256, can be formed in the thickness of about 0.5-1.5 microns so that the green light can be absorbed. Moreover, the first light-absorbing part 252, which is formed below the second light-absorbing part 254, can be formed in the thickness of about 1.5-3.0 microns so that the red light can be absorbed.

The first light-absorbing part 252, the second light-absorbing part 254 and the third light-absorbing part 256 are not formed with a metallic silicide layer above them. The first light-absorbing part 252, the second light-absorbing part 254 and the third light-absorbing part 256 are doped with the same impurities in the same concentration. Moreover, the widths of the first light-absorbing part 252, the second light-absorbing part 254 and the third light-absorbing part 256 can have sufficient widths to accommodate a photo incident path by the micro lens formed above the photo detector. This will be described later in more detail with reference to FIG. 6.

A source 220 and a drain 230 are doped with high-concentration p-type impurities and are formed on an N-well 215, which is formed on a p-type substrate 210. The first light-absorbing part 252 absorbs the red light from the incident light. Electrons of electron-hole pairs generated in the first light-absorbing part 252 by the absorbed red light are accumulated in an interface between an LDD area 223 of the source and an LDD area 233 of the drain and their adjacent first light-absorbing part 252. Then, by a tunneling effect occurred between the first light-absorbing part 252 and the LDD areas 223, 233, the electrons are discharged to the source 220 and the drain 230, and accordingly the quantity of electric charge of holes in the first light-absorbing part 252 is relatively increased, creating an electric field effect. As a result, a channel is formed in between the source 220 and the drain 230, and electric current flows. The quantity of generated electric current is proportional to the level of incidence of the red light.

The green light and blue light are respectively processed in 2 different tunnel junction photo detectors that are separated from the tunnel junction photo detector 200, which is for processing the red light.

Figure 4:
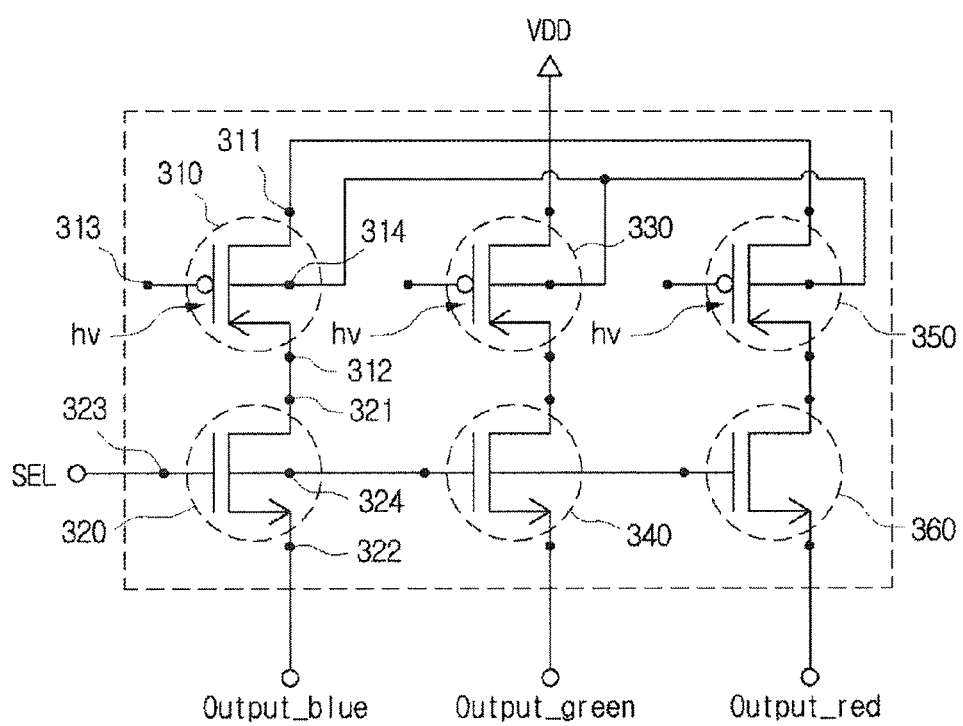
FIG. 4 is a circuit schematic of a unit pixel using the color tunnel junction photo detector in accordance with an embodiment of the present invention.

Illustrated in FIG. 4 is a circuit schematic of a unit pixel formed using three tunnel junction photo detectors 310, 330, 350 and three select transistors 320, 340, 360.

In FIG. 4, the tunnel junction photo detectors 310, 330, 350 can generate changes in current caused by optical pumping of blue light, green light and red light, respectively, and the three select transistors 320, 340, 360 can respectively transfer properties of the changes in current to an analog signal processor to complete color data. Hereinafter, the three tunnel junction photo detectors 310, 330, 350 will be respectively referred to as a blue tunnel junction photo detector 310, a green tunnel junction photo detector 330 and a red tunnel junction photo detector 350.

Among the three tunnel junction photo detectors 310, 330, 350, the red tunnel junction photo detector 350 is the only tunnel junction photo detector that absorbs light through a light-absorbing part, and the green tunnel junction photo detector 330 and the blue tunnel junction photo detector 310 do not absorb light.

A light-absorbing part of the green tunnel junction photo detector 330 (referred to as a "floating gate" hereinafter due to its non-light-absorbing nature) is connected with the second light-absorbing part 254 of the red tunnel junction photo detector 350, and the electrons generated in the second light-absorbing part 254 move to the floating gate of the green tunnel junction photo detector 330. The processes after this are identical to those of the green tunnel junction photo detector 350.

Likewise, a light-absorbing part of the green tunnel junction photo detector 310 ("floating gate" hereinafter) is connected with the third light-absorbing part 256 of the red tunnel junction photo detector 350, and the electrons generated in the third light-absorbing part 256 move to the floating gate. The processes after this are identical to those of the red tunnel junction photo detector 350.

The three select transistors 320, 340, 360 are serially connected to the blue tunnel junction photo detector 310, the green tunnel junction photo detector 330 and the red tunnel junction photo detector 350, respectively. The select transistor can be formed of various elements, for example, the conventional MOSFET structure. In this case, the tunnel junction photo detectors 310, 330, 350 and the select transistors 320, 340, 360 can be simultaneously realized using the general MOSFET manufacturing process, simplifying the manufacturing process and saving the cost.

The select transistors 320, 340, 360 can be constituted with NMOS. The drains of the select transistors 320, 340, 360 are respectively connected to the sources of the tunnel junction photo detectors 310, 330, 350, and the currents generated in the tunnel junction photo detectors 310, 330, 350 are transferred to unit pixel output terminals ("output_blue," "output_green" and "output_red") through the select transistors 320, 340, 360, respectively.

A control signal ("Sx") for the control of on-off of the select transistors 320, 340, 360 is supplied through its respective gate.

Figure 5:
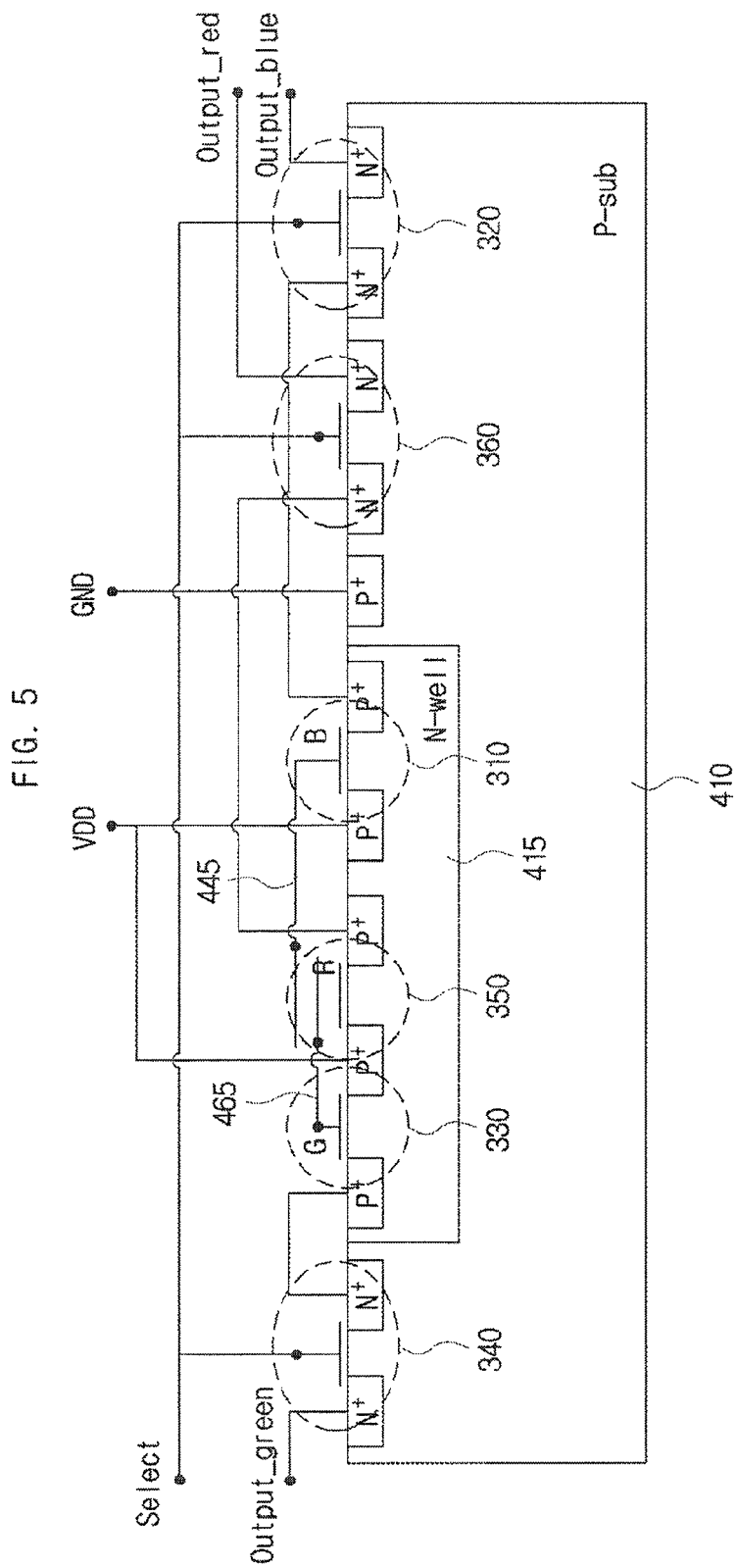
FIG. 5 is a cross-sectional view of a unit pixel using the color tunnel junction photo detector in accordance with an embodiment of the present invention.

FIG. 5 is a cross-sectional view of a unit pixel using the color tunnel junction photo detector in accordance with an embodiment of the present invention. As illustrated in FIG. 5, the three tunnel junction photo detectors 310, 330, 350, all of which have floated structures, are formed on a same N-well 415, which is formed on a p-type substrate 410.

The light-absorbing part 250 of the red tunnel junction photo detector 350 is constituted with a multilayer structure of the first light-absorbing part 252, which absorbs red light, the second light-absorbing part 254, which absorbs green light, and the third light-absorbing part 256, which absorbs blue light.

The second light-absorbing part 254 is connected with the floating gate of the green tunnel junction photo detector 330 that is formed adjacently. The second light-absorbing part 254 and the floating gate of the green tunnel junction photo detector 330 can be doped with the same impurities in the same concentration. Moreover, a connection line 465 between the second light-absorbing part 254 and the floating gate of the green tunnel junction photo detector 330 can be formed of poly-silicon or metal.

Similarly, the third light-absorbing part 256 is connected with the floating gate of the blue tunnel junction photo detector 310. The third light-absorbing part 256 and the floating gate of the blue tunnel junction photo detector 310 can be doped with the same impurities in the same concentration. Moreover, a connection line 445 between the third light-absorbing part 256 and the floating gate of the green tunnel junction photo detector 310 can be formed of poly-silicon or metal.

The floating gates of the green tunnel junction photo detector 330 and the blue tunnel junction photo detector 310 can both have a metallic silicide layer formed on an upper part thereof. The formed silicide layers can block the light from being absorbed at the floating gate of the green tunnel junction photo detector 330 and the blue tunnel junction photo detector 310. Through this, the unit pixel in accordance with an embodiment of the present invention can measure the change of current generated by the green light and the blue light absorbed through the second light-absorbing part 254 and the third light-absorbing part 256 only.

Since the select transistors 320, 340, 360 are formed on the p-type substrate 410, and the tunnel junction photo detectors 310, 330, 350 are separated on the N-well 415, the currents generated in the tunnel junction photo detectors can be transferred to the unit pixel output terminals more effectively.

FIG. 6 is a cross-sectional view for illustrating an incident angle of light of the color tunnel junction photo detector in accordance with an embodiment of the present invention.

In FIG. 6, the light converged through a micro lens 270 is incident to the third light-absorbing part 256, the second light-absorbing part 254 and the first light-absorbing part 252 in said order along a light incident path having a predetermined slope by multiple layers of shades 280.

In this case, the light incident path through which the light reaches from the micro lens 270 to the first light-absorbing part 252 converges in such a way that the light can have a focus at an area below the first light-absorbing part 252. That is, the area at which the light is incident becomes wider from the first light-absorbing part 252 to the third light-absorbing part 256. Therefore, the area of the third light-absorbing part 256 can be the widest, and the area of the second light-absorbing part 254 can be between the area of the third light-absorbing part 256 and the area of the first light-absorbing part 252, which is designed to be the W/L.

In the shades 280, metal lines, which are for signal transfer and device control, can be arranged along the incident path. Formed in between the multiple layers of shades 280 can be passivation layers 290, which can be formed with a material that has little reflection of the incident light.

In case the tunnel junction photo detector does not have the micro lens, the incident light may not be collimated to a particular focal point, in which case the first light-absorbing part 252, the second light-absorbing part 254 and the third light-absorbing part 256 may be formed to have the same area.

Through the above structure of color tunnel junction photo detector, it is possible to cause the flow of photoelectric currents that are much greater than the conventional photo diode. While the conventional photo diode distinguishes the brightness only by the quantity of electric charge accumulated in the electrostatic capacity, the change in the quantity of electric charge of the light-absorbing part caused by the light works as the electric field effect in the above structure of color tunnel junction photo detector, thereby controlling the electric current flow of the channel. Moreover, since the required electric charge can be infinitely supplied through the drain, a signal can be self-amplified in the photo detector. Therefore, it is possible to realize a unit pixel of an image sensor without introducing an additional signal amplification device, like in a PPS structure. Of course, in addition to the PPS method, it is also possible to realize a unit pixel using the conventional APS method.

Hitherto, the unit pixel of an image sensor as well as the photo detector constituting the unit pixel having the technical features of the present invention have been described through an embodiment.

The unit pixel described in the embodiment can be arranged in a two dimensional array in the conventional VGA, HD and Full HD methods, like 640*480, 1280*720 and 1920*1080, to form one frame.

Through the above structure, it is possible that the unit pixel of the present invention allows a relatively greater quantity of photoelectric currents than the conventional photo diode. This is because, unlike the conventional photo diode in which contrast is distinguished by the quantity of electric charge accumulated in the electrostatic capacity only, the present invention controls the electric current flow of the source-drain channels owing to the electric field effect from the change in the quantity of electric charge of the floating gate and at the same time has the configuration of self-amplification owing to infinite supply of electric charges through the drain.

Moreover, through the above structure, it is possible to realize a high-sensitivity/high-speed image sensor. Also, it is possible for the unit pixel to realize the PPS method. In this case, since there is little or no parasitic capacitor compared to the output current of the photo detector inside the pixel, there cannot be any integration action until a pixel is selected by a row decoder. This is one of the major differences from a CIS unit pixel of the conventional APS method. Therefore, it becomes possible to develop a high-speed frame image sensor by multi-processing a signal in a modified rolling shutter method.

Since the unit pixel has a very simple structure and is not big, images of 500-10,000 fps can be realized by forming a capacitor inside the unit pixel like the global shutter method, storing data simultaneously in an analog memory and reading the data in high speed.

The above description has been provided in illustrative purposes only, and it shall be appreciated that it is possible for any ordinarily skilled person in the art to which the present invention pertains to easily modify the present invention without departing the technical ideas and essential features of the present invention. As used herein, the term "aspect" may be used interchangeably with the term "embodiment."

Therefore, it shall be appreciated that the embodiment described above is illustrative, not restrictive. For instance, any elements described to be combined can be also embodied by being separated, and likewise, any elements described to be separated can be also embodied by being combined.

The scope of the present invention shall be defined not by the above description but rather by the claims appended below, and it shall be understood that all possible permutations or modifications that can be contrived from the meanings, scopes and equivalents of the claims are included in the scope of the present invention.

What is claimed is:

1. A photo detector configured to absorb light in a unit pixel of an image sensor transforming the absorbed light to an electrical signal, comprising:
    a light-absorbing part configured to absorb light by being formed in a floated structure;
    an oxide film having one surface thereof being in contact with the light-absorbing part;
    a source being in contact with one side of the other surface of the oxide film and separated from the light-absorbing part with the oxide film therebetween;
    a drain facing the source so as to be in contact with the other side of the other surface of the oxide film and separated from the light-absorbing part with the oxide film therebetween; and
    a channel formed between the source and the drain and configured to form flow of an electric current between the source and drain,
    wherein the light-absorbing part is doped with first type impurities, and the source and the drain are doped with second type impurities,
    wherein the light-absorbing part is insulated from the source and the drain by the oxide film,
    wherein the light-absorbing part comprises:
    a first light-absorbing part being in contact with the oxide film and configured to absorb red light of the absorbed light;
    a second light-absorbing part formed above the first light-absorbing part and configured to absorb green light of the absorbed light;
    a third light-absorbing part formed above the second light-absorbing part and configured to absorb blue light of the absorbed light;
    a first insulation layer formed in between the first light-absorbing part and the second light-absorbing part; and
    a second insulation layer formed in between the second light-absorbing part and the third light-absorbing part,
    wherein electron-hole pairs are formed in the light-absorbing part by light incident to the light-absorbing part, tunneling occurs through the oxide film between at least one of the source and the drain and the light-absorbing part, electrons of the electron-hole pairs are discharged to at least one of the source and the drain from the light-absorbing part by the tunneling, and flow of electric current of the channel is controlled by a change in the quantity of electric charge of the light-absorbing part by the discharge of the electrons, and
    wherein the light-absorbing part is formed of poly-silicon.

2. The photo detector of claim 1, wherein the first light-absorbing part, the second light-absorbing part and the third light-absorbing part are not formed with a metallic silicide layer on an upper surface thereof.

3. The photo detector of claim 1, the light-absorbing part, the second light-absorbing part and the third light-absorbing part are doped with same impurities in same concentrations.

4. The photo detector of claim 1, wherein the channel is formed in a state immediately before pinch-off by adjusting a W/L ratio, which is a ratio between a width (W) and a length (L) of the channel.

5. The photo detector of claim 1, wherein a threshold voltage of the photo detector is changed due to a tunneling effect occurred in the oxide film.

6. The photo detector of claim 1, further comprising a light-blocking layer formed on a surface other than the light-absorbing part and configured to block transmission of light in areas other than the light-absorbing part.

7. A unit pixel of an image sensor configured to transform absorbed light to an electrical signal, comprising:
    a photo detector configured to cause an electric current to flow using a change in the quantity of electric charge caused by incident light; and
    a select device configured to output the electric current generated by the photo detector to a unit pixel output terminal,
    wherein the photo detector comprises:
    a light-absorbing part formed in a floated structure, electron-hole pairs being generated by the absorbed light in the light-absorbing part;
    an oxide film having one surface thereof being in contact with the light-absorbing part;
    a source being in contact with one side of the other surface of the oxide film and separated from the light-absorbing part with the oxide film therebetween;
    a drain facing the source so as to be in contact with the other side of the other surface of the oxide film and separated from the light-absorbing part with the oxide film therebetween; and
    a channel formed between the source and the drain and configured to form flow of an electric current between the source and drain,
    wherein the light-absorbing part is doped with first type impurities, and the source and the drain are doped with second type impurities,
    wherein the light-absorbing part is insulated from the source and the drain by the oxide film,
    wherein tunneling occurs through the oxide film between at least one of the source and the drain and the light-absorbing part, electrons of the electron-hole pairs are discharged to at least one of the source and the drain from the light-absorbing part by the tunneling, and flow of electric current of the channel is controlled by a change in the quantity of electric charge of the light-absorbing part by the discharge of the electrons,
    wherein the photo detector comprises a red photo detector, a green photo detector and a blue photo detector,
    wherein a light-absorbing part of the red photo detector comprises: a first light-absorbing part being in contact with the oxide film and configured to absorb red light of the absorbed light; a second light-absorbing part formed above the first light-absorbing part and configured to absorb green light of the absorbed light; a third light-absorbing part formed above the second light-absorbing part and configured to absorb blue light of the absorbed light; a first insulation layer formed in between the first light-absorbing part and the second light-absorbing part; and a second insulation layer formed in between the second light-absorbing part and the third light-absorbing part,
    wherein a light-absorbing part of the green photo detector is connected with the second light-absorbing part by a first connection line,
    wherein a light-absorbing part of the blue photo detector is connected with the third light-absorbing part by a second connection line,
    wherein the select device comprises: a drain being connected with the source of the photo detector; a source being accessed to the unit pixel output terminal; and a gate configured to receive a control signal from an outside, and a switching operation is performed based on the control signal, and wherein the select device comprises: a first select device connected to the red photo detector; a second select device connected to the green photo detector; and a third select device connected to the blue photo detector.

8. The unit pixel of claim 7, wherein a metallic silicide layer is formed above the light-absorbing part of the green photo detector and the light-absorbing part of the blue photo detector.

9. The unit pixel of claim 7, wherein the first connection line and the second connection line are made of poly-silicon or metal.

10. The unit pixel of claim 7, further comprising a light-blocking layer formed on a surface other than the light-absorbing part of the red photo detector and configured to block transmission of light in areas other than the light-absorbing part of the red photo detector, wherein the light-absorbing parts of the red photo detector and the green photo detector are blocked from light by the light-blocking layer.

11. The unit pixel of claim 7, wherein the channel is formed in a state immediately before pinch-off by adjusting a W/L ratio, which is a ratio between a width (W) and a length (L) of the channel.

12. The unit pixel of claim 7, further comprising a micro lens configured to converge light incident to the photo detector, wherein a light incident path from the micro lens to the first light-absorbing part has a focal point below the first light-absorbing part.

13. The unit pixel of claim 12, wherein the light incident path is defined by arrangement of multiple layers of metal lines formed between the micro lens and the third light-absorbing part.

* * * * *